US006980049B2

(12) United States Patent
Burkhard

(10) Patent No.: US 6,980,049 B2
(45) Date of Patent: Dec. 27, 2005

(54) POLYPHASE-NOTCHFILTER

(75) Inventor: Dick Burkhard, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 88 days.

(21) Appl. No.: 10/123,794

(22) Filed: Apr. 16, 2002

(65) Prior Publication Data

US 2002/0153942 A1  Oct. 24, 2002

(30) Foreign Application Priority Data

Apr. 17, 2001  (EP) .................................. 01109516

(51) Int. Cl.[7] .............................................. H03K 1/10
(52) U.S. Cl. ...................................... 327/557; 327/552
(58) Field of Search ................................ 327/551, 552, 327/557

(56) References Cited

U.S. PATENT DOCUMENTS

| | | | |
|---|---|---|---|
| 4,884,036 A | * | 11/1989 | Koyama et al. ............ 327/557 |
| 5,220,686 A | | 6/1993 | Kasperkovitz et al. ... 455/234.1 |
| 6,069,522 A | * | 5/2000 | Venkatraman et al. ...... 327/552 |
| 6,184,748 B1 | * | 2/2001 | Rao et al. ................... 327/552 |
| 6,429,733 B1 | * | 8/2002 | Pagliolo et al. ............. 327/552 |
| 6,512,414 B2 | * | 1/2003 | Yokoyama et al. ......... 327/553 |

\* cited by examiner

Primary Examiner—Terry D. Cunningham
(74) Attorney, Agent, or Firm—Michael J. Ure

(57) ABSTRACT

The invention relates to a Polyphase-Notchfilter for filtering input signals comprising known bandpass filters, which comprise voltage-controlled current sources. To provide an integrated circuit that has notch filter functionality with reduced circuit erogation, that allows high suppression with little matching effort and reduced power consumption it is proposed that at least two second voltage-controlled current sources are provided, that said at least four input means are coupled to said at least two second voltage-controlled current sources, and that said at least four output means are coupled to said at least two second voltage-controlled current sources, and that said at least one second voltage-controlled current sources are coupled antiparallel to bandpass filter.

11 Claims, 15 Drawing Sheets

POLYPHASE-NOTCHFILTER

The invention relates to a polyphase-notchfilter for filtering input signals comprising, bandpass filter means comprising, at least four first voltage-controlled current sources, at least four input means coupled to said at least four first voltage-controlled current sources for connecting input signals to said bandpass filter means, at least four output means coupled to said at least four first voltage-controlled current sources, providing filtered output signals of said input signals, and supply voltage input means for connecting a power supply for said circuit arrangement. The invention further relates to a method for polyphase-notchfiltering signals, and the use of such a polyphase-notchfilter in a transmission system.

In many applications, interference frequencies have to be filtered. To be able to suppress these interference frequencies, notch filters are used. Notch filters allow to suppress certain frequencies within a frequency band. In applications such as radio-frequency-filters and intermediate-frequency-filters, notch filters are used.

Figure 1:
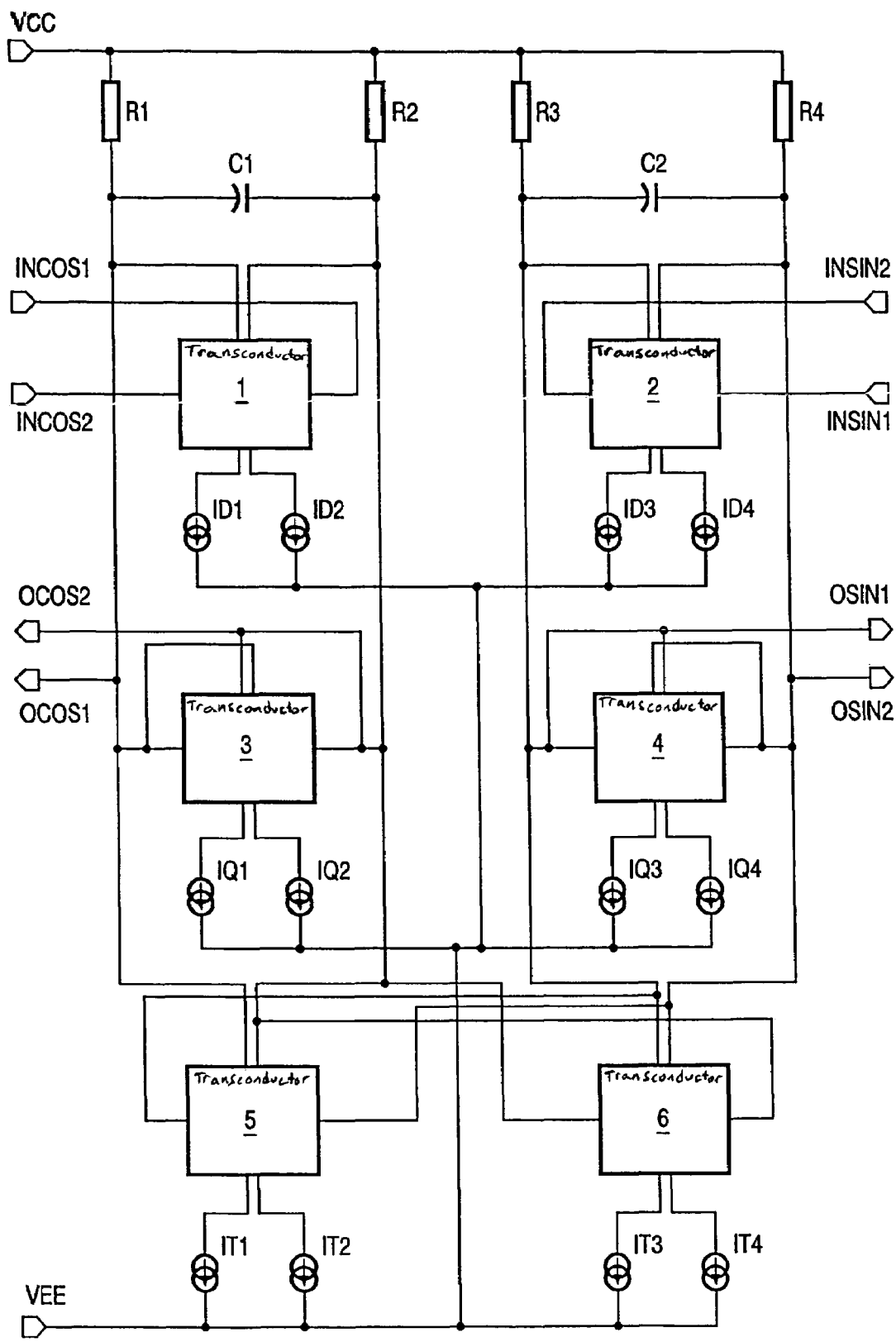

From "Integrated Tunable Resonance Amplifier", Kasperkovitz, et. al, 15th Europeam Solid State Conference '89, and U.S. Pat. No. 5,220,686 an integrated tunable resonance amplifier, where amplification, selection and tuning is possible on one single integrated circuit, is known. The disclosed polyphase bandpass filter may be used in radio-frequency receivers. In FIG. 1 such a bandpass filter is shown. This bandpass filter comprises transconductors 1–6. Also resistors R1–R4, capacitors C1–C2, and current sources ID1–ID4, IQ1–IQ4, IT1–IT4 are provided. The shown polyphase bandpass filter is connected to a power supply VCC, potential mass VEE, input ports INCOS 1–2, INSIN 1–2, and output ports OCOS 1–2, and OSIN 1–2. The voltage difference between the output ports OCOS1–2, OSIN 1–2 is used for further processing of the signal. Signals fed to said input ports INCOS 1–2 and INSIN 1–2 are 90° phase shifted. The voltage difference between INCOS 1 and INCOS 2 (INSIN 1, INSIN 2) is in general a harmonic wave, e.g. a sine- or a cosine-wave. Each transconductor 1–6 comprises voltage input ports basinv and bas as well as current output ports colinv, emiinv, and col, emi. The voltage between INCOS 1, INCOS 2 (INSIN 1, INSIN 2) is fed to bas, basinv of transconductor 1 (2).

The output col (colinv) of transconductor 1 is fed to R1 (R2), OCOS1 (OCOS2), bas (basinv), colinv (col) of transconductor 3, col (colinv) of transconductor 5, bas (basinv) of transconductor 6. The voltage between col, colinv of transconductor 1 is lowpass filtered by R1, R2, C1.

The output col (colinv) of transconductor 2 is fed to R4 (R3), OSIN2 (OSIN1), bas (basinv), colinv (col) of transconductor 4, col (colinv) of transconductor 6, basinv (bas) of transconductor 5. The voltage between col, colinv of transconductor 2 is lowpass filtered by R3, R4, C2.

The output emi (emiinv) of transconductor 1 is fed over ID1 (ID2) to reference voltage VEE. The output emi (emiinv) of transconductor 2 is fed over ID3 (ID4) to reference voltage VEE. The output emi (emiinv) of transconductor 3 is fed over IQ1 (IQ2) to reference voltage VEE. The output emi (emiinv) of transconductor 3 is fed over IQ3 (IQ4) to reference voltage VEE. The output emi (emiinv) of transconductor 3 is fed over IQ3 (IQ4) to reference voltage VEE. The output emi (emiinv) of transconductor 6 is fed over IT3 (IT4) to reference voltage VEE.

Figure 2:
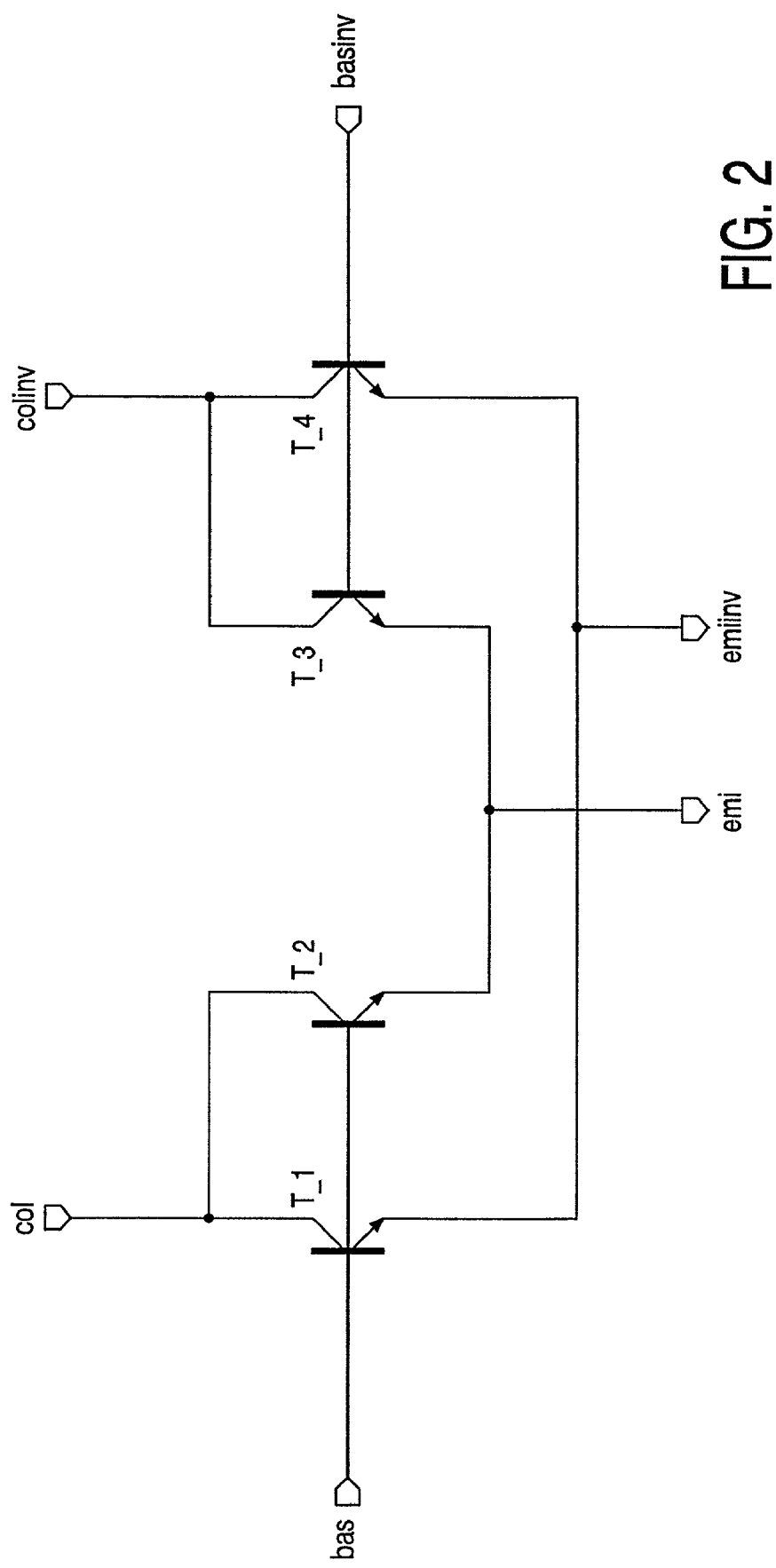

In many applications a differential amplifier is used as transconductor. Such a differential amplifier is depicted in FIG. 2. The shown differential amplifier comprises transistors T_1–T_4. The transistors T_1–T_4 control a current through their collectors (col, colinv) according to a voltage between base (bas, basinv) and emitter (emi, emiinv). In the shown differential amplifier, the emitter currents are added. In case these emitter currents are kept constant, e.g. by means of a current source, the currents in the outputs col, colinv depend on the voltage ratio bas/basinv.

As shown in FIG. 1, the current sources ID, IQ, and IT are connected to the ports emi, emiinv of transconductors 1–6. The current through these ports is constant, according to the value ID, IQ, an IT, respectively. That causes the currents through col, colinv to be dependant on the voltage ratio of the input ports bas, basinv. The transconductors 3, 4 may be omitted. In that case, the q-value cannot be controlled anymore.

The signals fed to the input ports INSIN, INCOS are 90° phase shifted. The signals fed to ports INSIN1, INSIN2, as well as INCOS1, INCOS2 are amplified and bandpass filtered by the shown polyphase bandpass filter. After bandpass filtering, the signals are fed to OSIN1, OSIN2 as well as OCOS1, OCOS2, respectively. These output signals are 90° phase shifted, as well.

Figure 4:
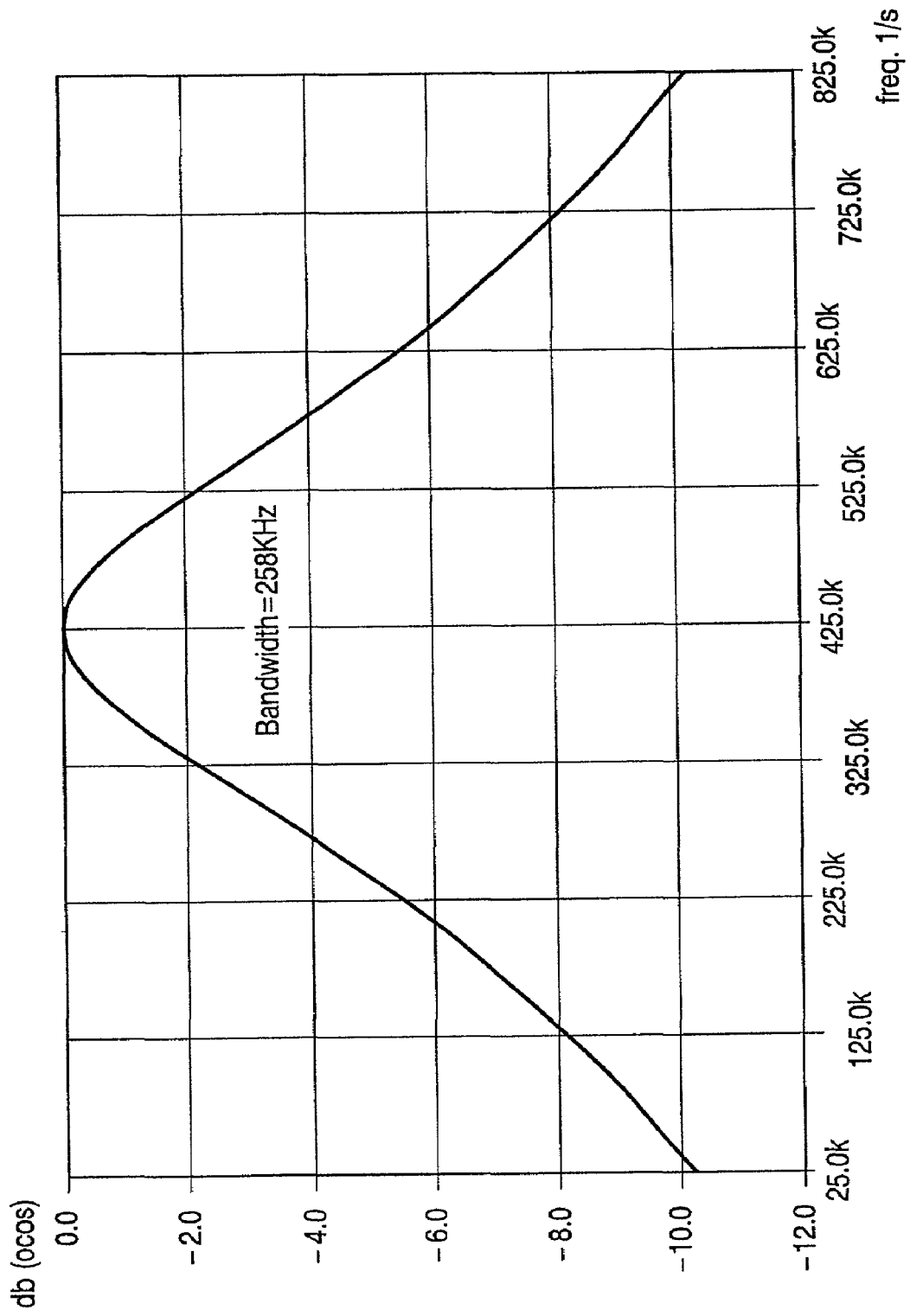

A transfer function of a polyphase bandpass filter shown in FIG. 1 can be seen from FIG. 4. The ordinate shows the amplitude of the output signal OCOS in decibel. The abscissa represents the frequency of the output signal. In this case the resonance frequency is 425 kHz. The 3 db bandwidth is 258 kHz, which is the Q-value.

Figure 3:
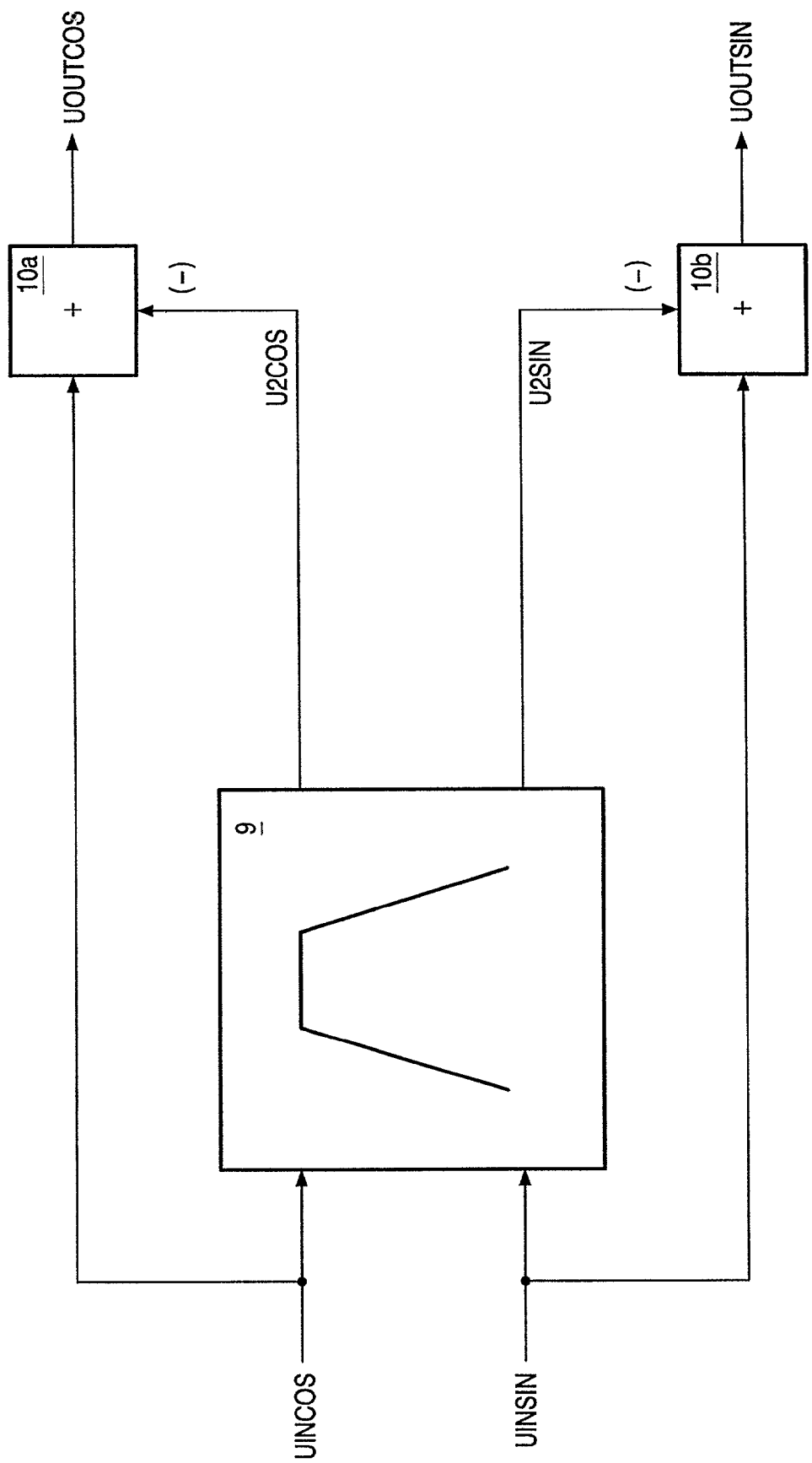

The general structure of a polyphase-notchfilter can be seen from FIG. 3. In FIG. 3 a resonance amplifier function 9 and an adding function 10 is shown. Signals UINCOS, UINSIN, which are 90° phase shifted, fed to resonance amplifier function 10 are bandpass filtered by said resonance filter function 9. The filtered signals U2COS, U2SIN are inverted and fed to said adding function 10. In case, the signals UINCOS, U2COS, and UINSIN, U2SIN are in-phase, respectively, and the absolute values of said signals are similar, high suppression of the selected frequencies is possible. But a good transfer function is only possible, if the components are matched well. Also the number of components to be integrated in such a polyphase-notchfilter is high.

Figure 5:
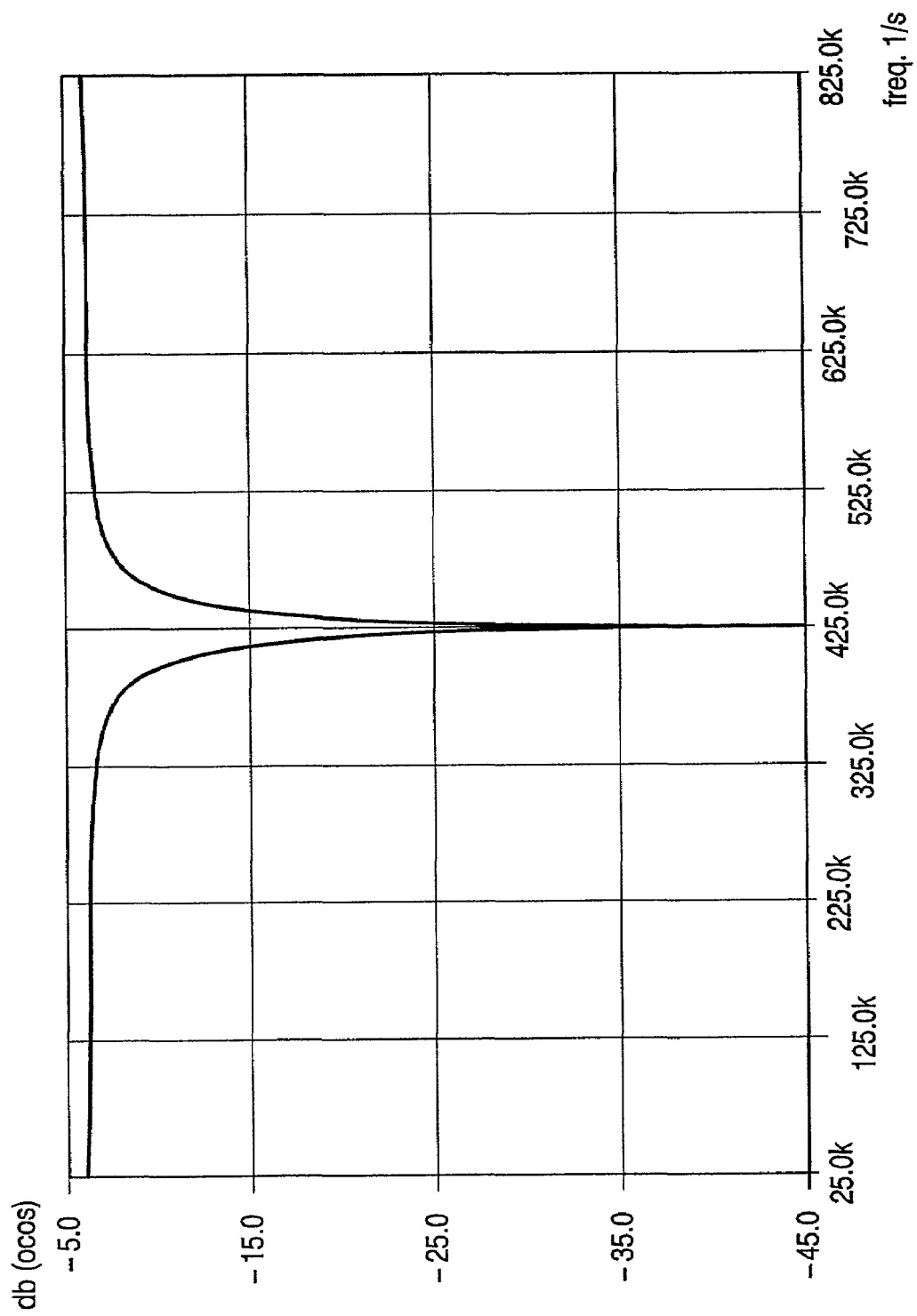

A transfer function of a polyphase-notchfilter can be seen from FIG. 5. The ordinate shows the amplitude of the output signal ONOCOS in decibel. The abscissa represents the frequency of the output signal. The resonance frequency is 425 kHz. Frequencies of about 425 kHz are filtered by this polyphase-notchfilter. The bandwidth has to be narrow, as only one particular frequency should be filtered. It is important that at least on of the values Q-value, amplification and resonance frequency can be adjusted in a polyphase-notchfilter. To achieve a good suppression, the components used in a known polyphase-notchfilter have to be matched well. That means that only small relative tolerances between certain components are allowed.

As in many applications, a polyphase-notchfilter should be integrated in one circuit, it is a problem to achieve a high suppression of the selected frequency. A good matching of certain components is difficult when integrating the components on an integrated circuit. A further problem is that the number of used components in known polyphase-notchfilters is high. Also in known polyphase-notchfilters, the power consumption is high.

All these factors cause a bad integration of a polyphase-notchfilters on an integrated circuit. It is an object of the invention, to provide a polyphase-notchfilter on one integrated circuit with reduced circuit erogation. It is also an object of the invention to allow high suppression in the polyphase-notchfilter with little matching effort. It is yet another object of the invention to reduce power consumption of the integrated circuit. A further object of the invention is to provide a polyphase-notchfilter, which filters 90° phase shifted input signals, and puts out 90° phase shifted output signals.

The objects of the invention are solved by a polyphase-notchfilter where at least two second voltage-controlled current sources are provided, where said at least four input means are coupled to said at least two second voltage-controlled current sources, and where said at least four output means are coupled to said at least two second voltage-controlled current sources, and where said at least two second voltage-controlled current sources are coupled anti-parallel to two of said at least four first voltage-controlled current sources of said filter means, respectively. Preferably said filter means comprise six voltage-controlled current sources, four input means, and four output means. A pair of two of said input means are coupled to two input ports of said second voltage-controlled current sources, respectively. These pairs are also coupled to input ports of two first voltage-controlled current sources. The input ports of said second voltage controlled current sources are coupled anti-parallel to input ports of two of said first voltage controlled current sources. That means that an inverted input port of said second voltage-controlled current source is coupled to a non-inverted input port of said first voltage-controlled current source, and vice versa.

One preferred embodiment is described in claim 2. The current through said current output means is controlled by a voltage provided to said input means. The current through said output means of said first and said second voltage-controlled current sources may be controlled by said current source. In that case the current through the output means is constant. As an example, a current ratio which depends on a voltage ratio can be realised if said voltage-controlled current sources comprise two input ports and four output ports. As the current through the output ports is constant, the ratio between these currents only depends on the voltage ratio at the input ports. It is thus possible to control the resonance frequency, the Q-value, which is represented by the 3 db bandwidth of the frequency resonance, and the amplification of the polyphase-notchfilter by adjusting the currents through said voltage-controlled current sources.

By providing voltage-controlled current sources according to claim 3, it is possible to generate a current ratio at the output ports that depends on the voltage ratio between said inverted and said non-inverted input means.

According to claim 4, a voltage-controlled current source can be easily integrated on an integrated circuit. As a transconductor comprises transistors, the integration of these components is easy.

By providing a voltage divider circuit according to claim 5, the amplification of the Polyphase-notchfilter may be adjusted with the resistors in the voltage divider circuit.

By using a voltage divider circuit according to claim 6, the input and output means of said voltage-controlled current sources are voltage divided. By that, a better suppression of frequencies above the resonance frequency can be realised. The transfer function may be adjusted. That is advantageous in case the polyphase-notchfilter is coupled to further bandpass filters, which resonance frequencies are below the resonance frequency of the notch filter.

A better decoupling between said filter means and said second voltage-controlled current sources can be attained according to claim 7. Said decoupling means may be transistors. These transistors are coupled with their base to a reference voltage. Their collectors may be coupled to said power supply voltage, e.g. over a resistor, respectively. Their emitter may be coupled to said first voltage controlled current sources, e.g. over a resistor, respectively. Said output means may be coupled to said collector or said emitter, respectively.

A filter according to claim 8 can be used to filter higher harmonics by said lowpass. In case said input signals comprise higher harmonics, these harmonics are filtered by a first lowpass filter, which is connected to said first voltage controlled current sources. To allow an easy adding of the currents at the output means, the higher harmonics of said input signal are also lowpass filtered at the output ports of said second voltage controlled current sources. Said first and said second lowpass filter may have the same transfer function. In that case, even signals which comprise higher harmonics may be filtered by said polyphase-notchfilter easily.

A filter according to claim 9 is further proposed. By that, said voltage controlled current sources are coupled to a reference potential jointly.

One further aspect of the invention is a method for notch-filtering signals with one of the pre-described polyphase-notchfilters, where first and second input signals are fed to said polyphase-notchfilter, where said first and said second input signals are 90° phase shifted, where said first and second input signals are bandpass filtered with polyphase bandpass filter means, where first and second currents are generated by said polyphase bandpass filter means, where said first and second input signals are transferred into inverted third and fourth currents by voltage controlled current sources, where said first currents are added to said third currents and said second currents are added to said fourth currents, proving first and second output signals being a notch-filtered input signal and being 90° phase shifted.

A method according to claim 11 allows a cascade of polyphase-filter. These may be notchfilters, bandpass filters, low- and highpass filters. All these filters may in that case be polyphase-filters, which require 90° phase shifted input signals and provide 90° phase shifted output signals.

The use of one of the pre-described polyphase-notchfilters or a pre-described method for suppression of interfering frequencies in transmission systems is yet another aspect of the invention.

Figure 6:
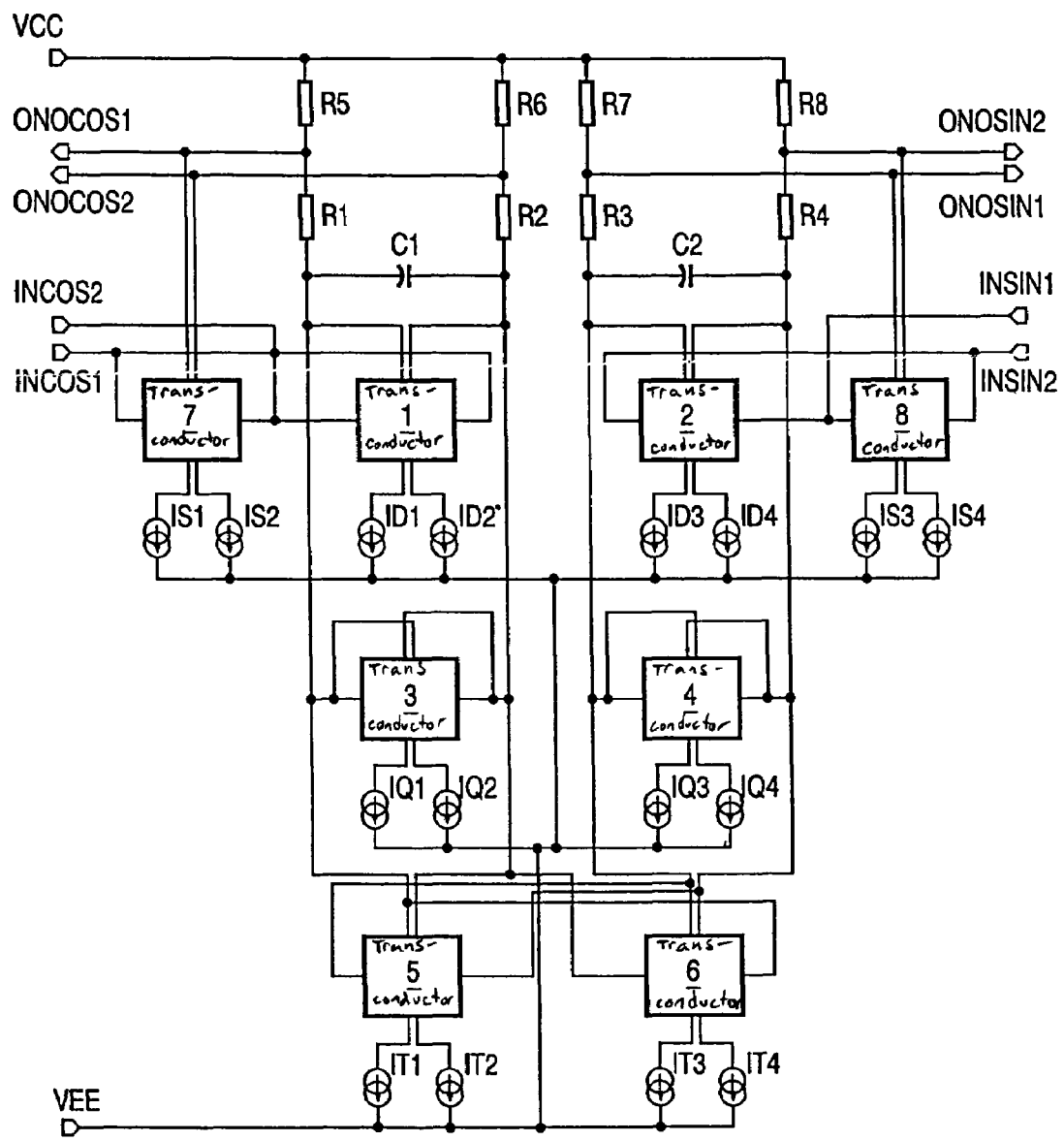
Figure 7:
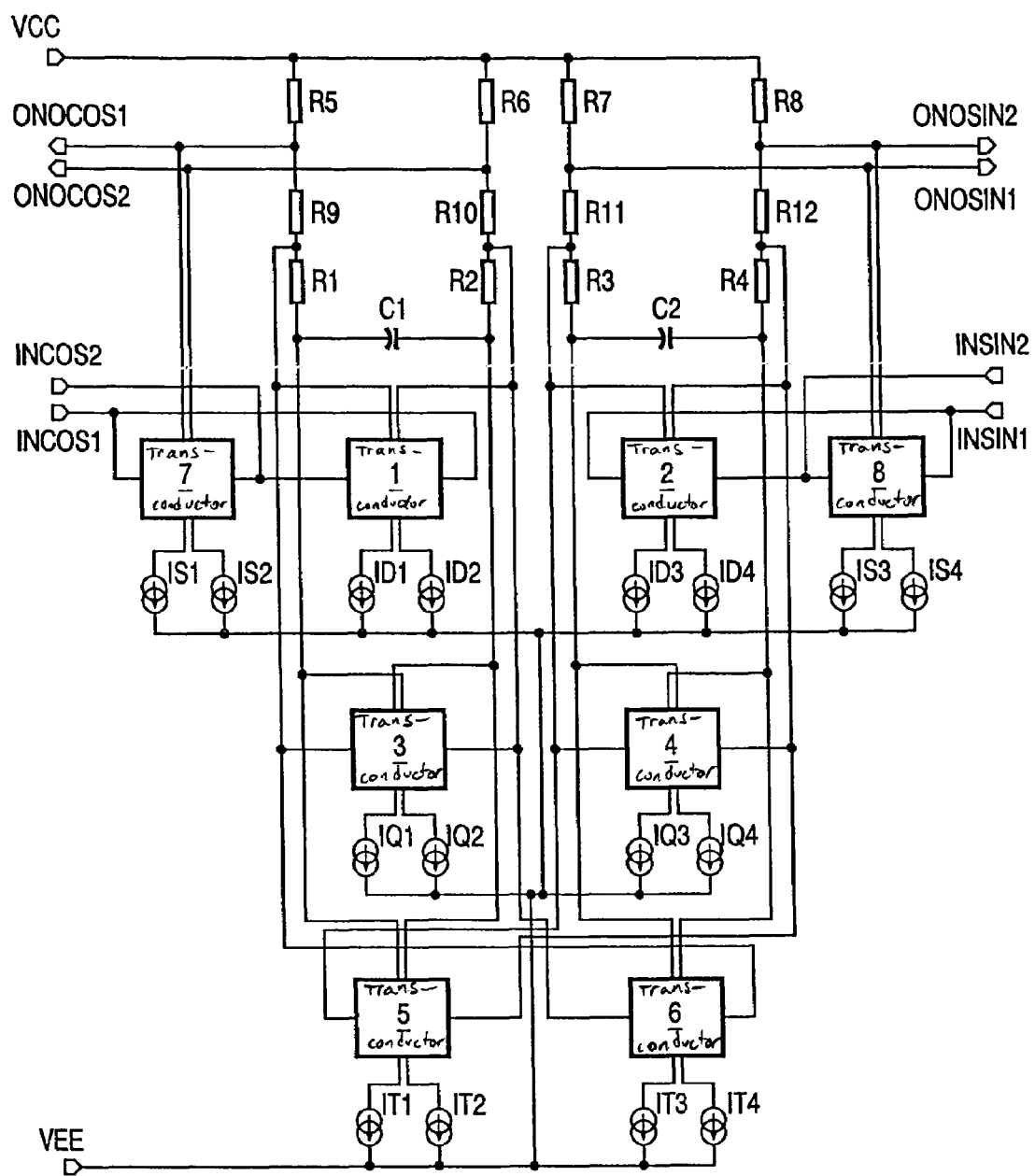
Figure 8:
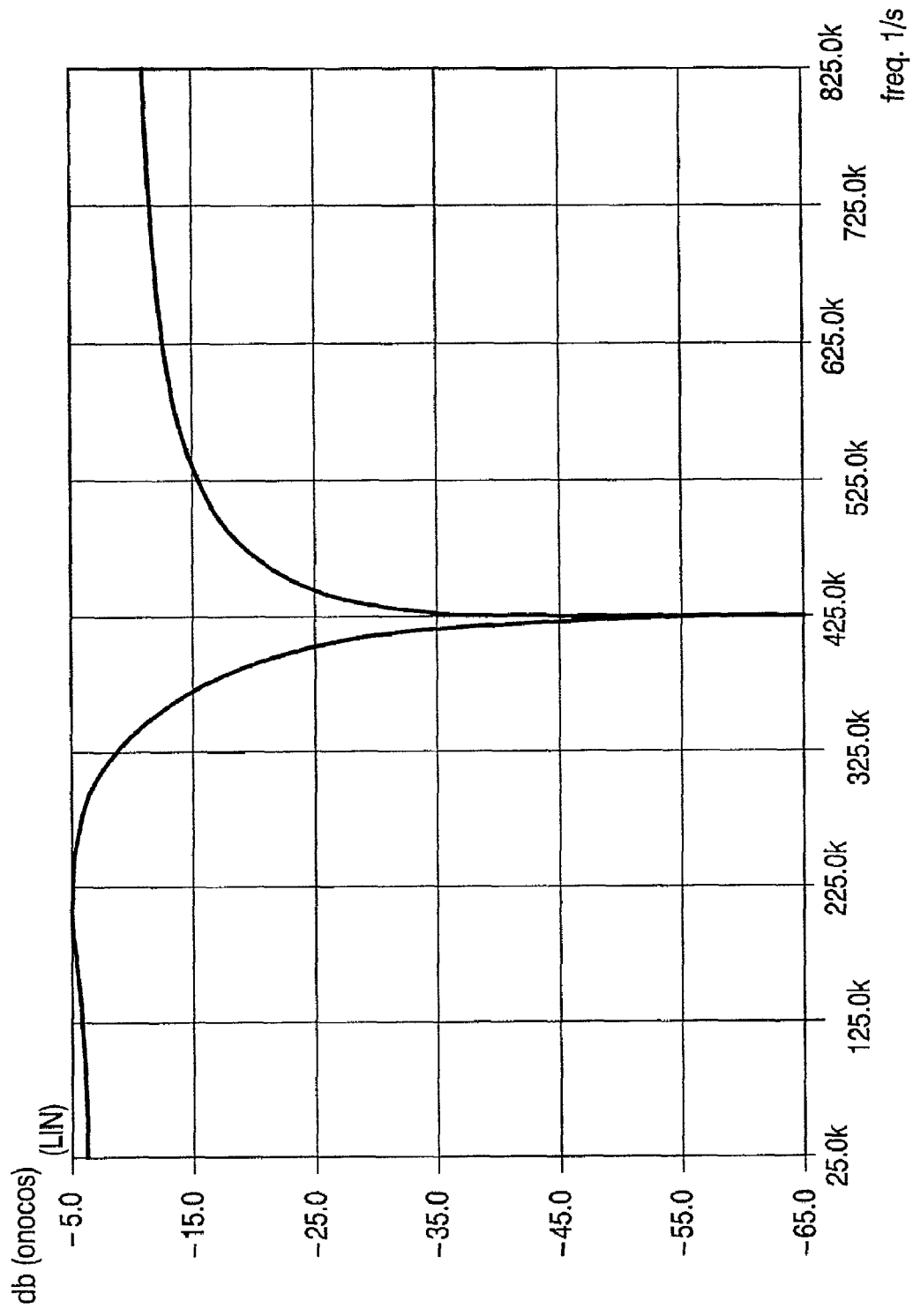
Figure 9:
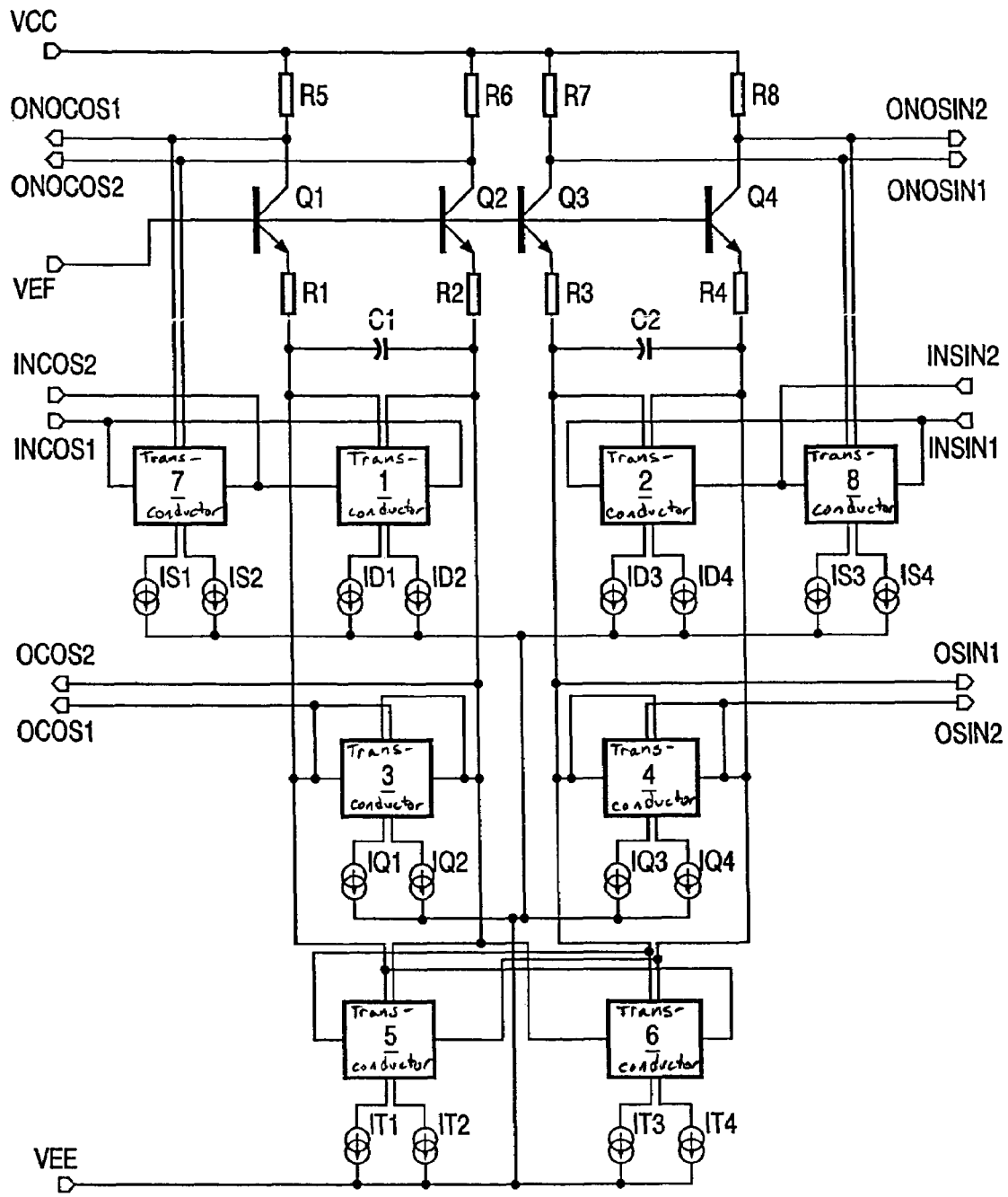
Figure 10:
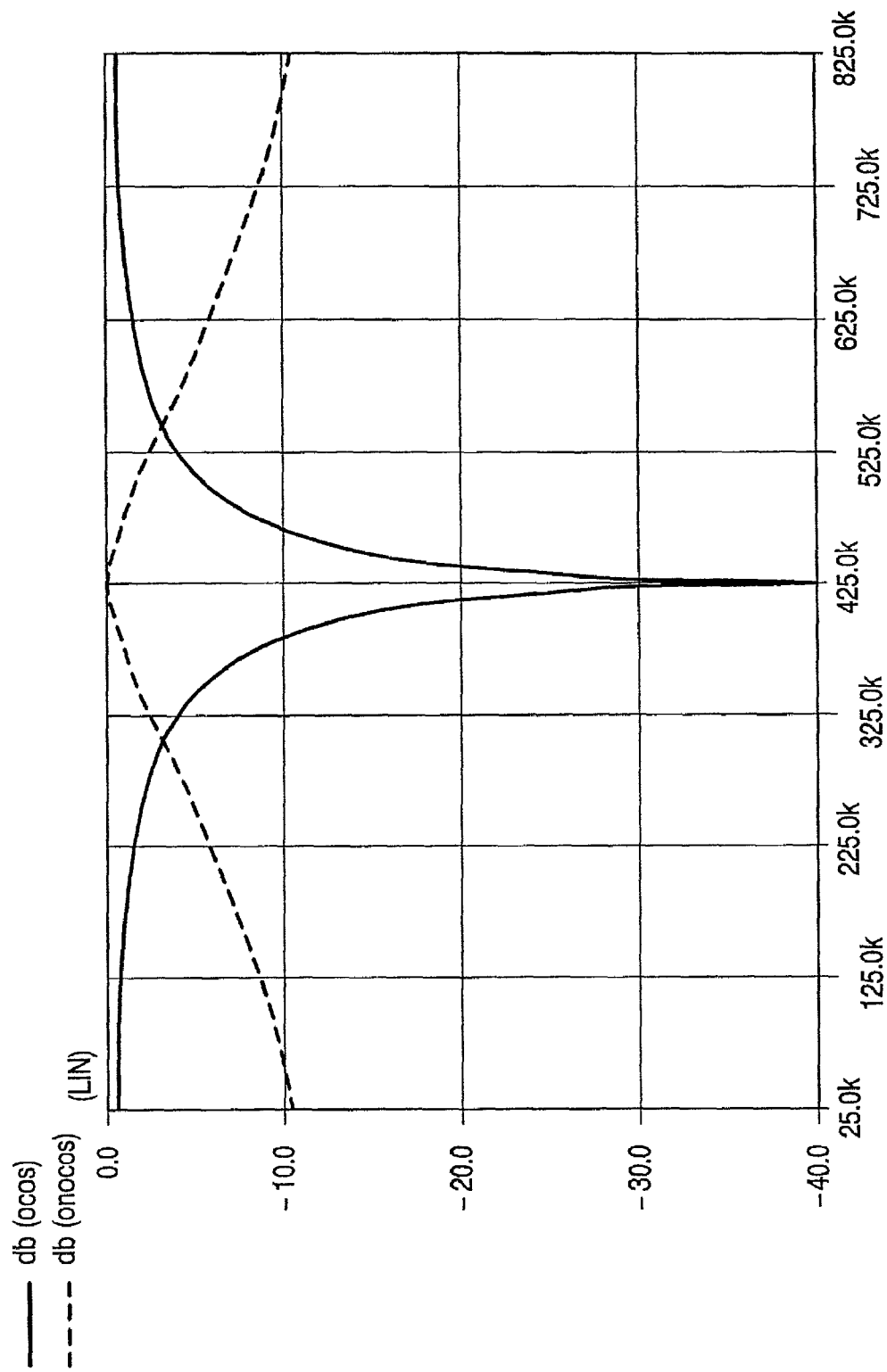
Figure 11:
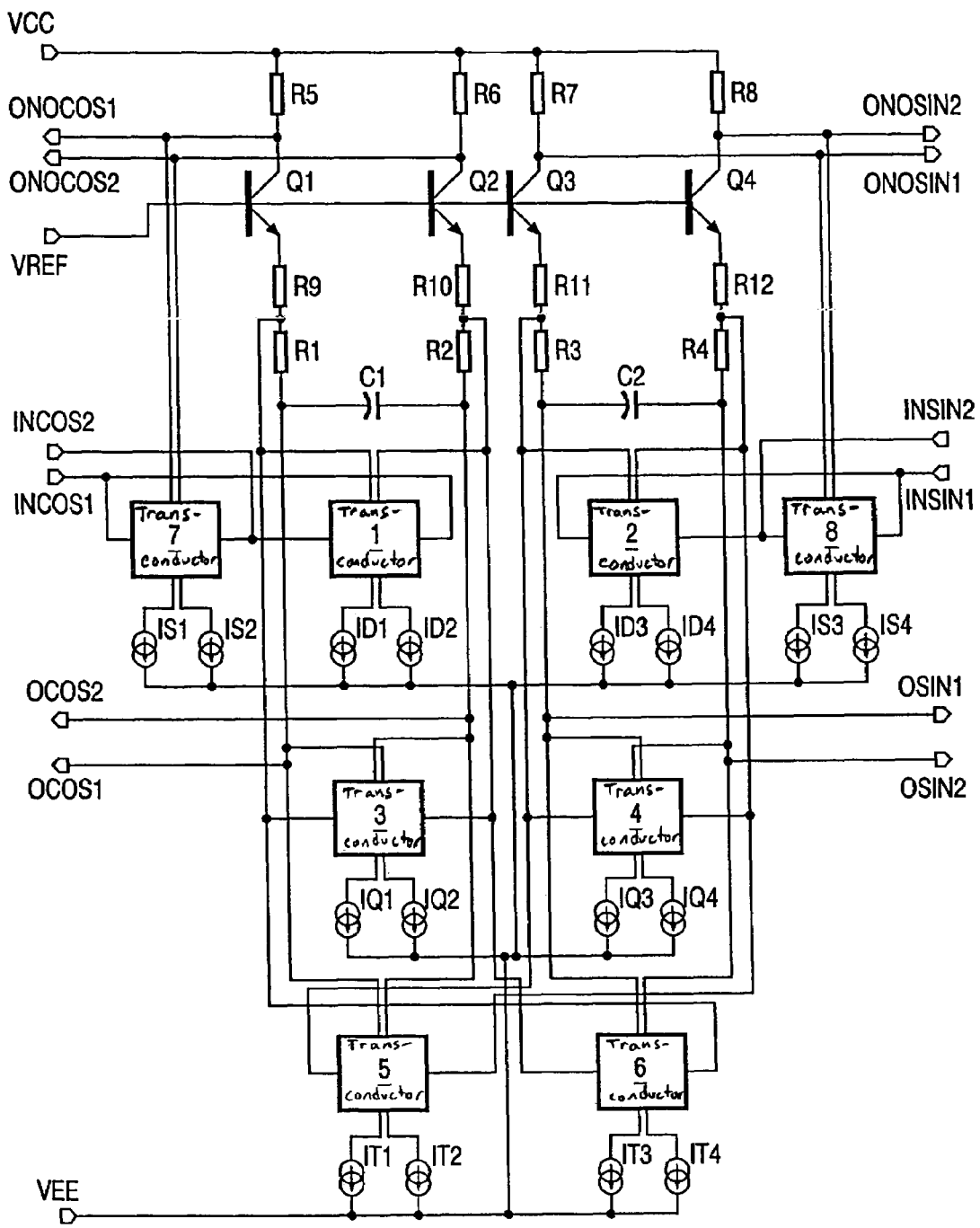
Figure 12:
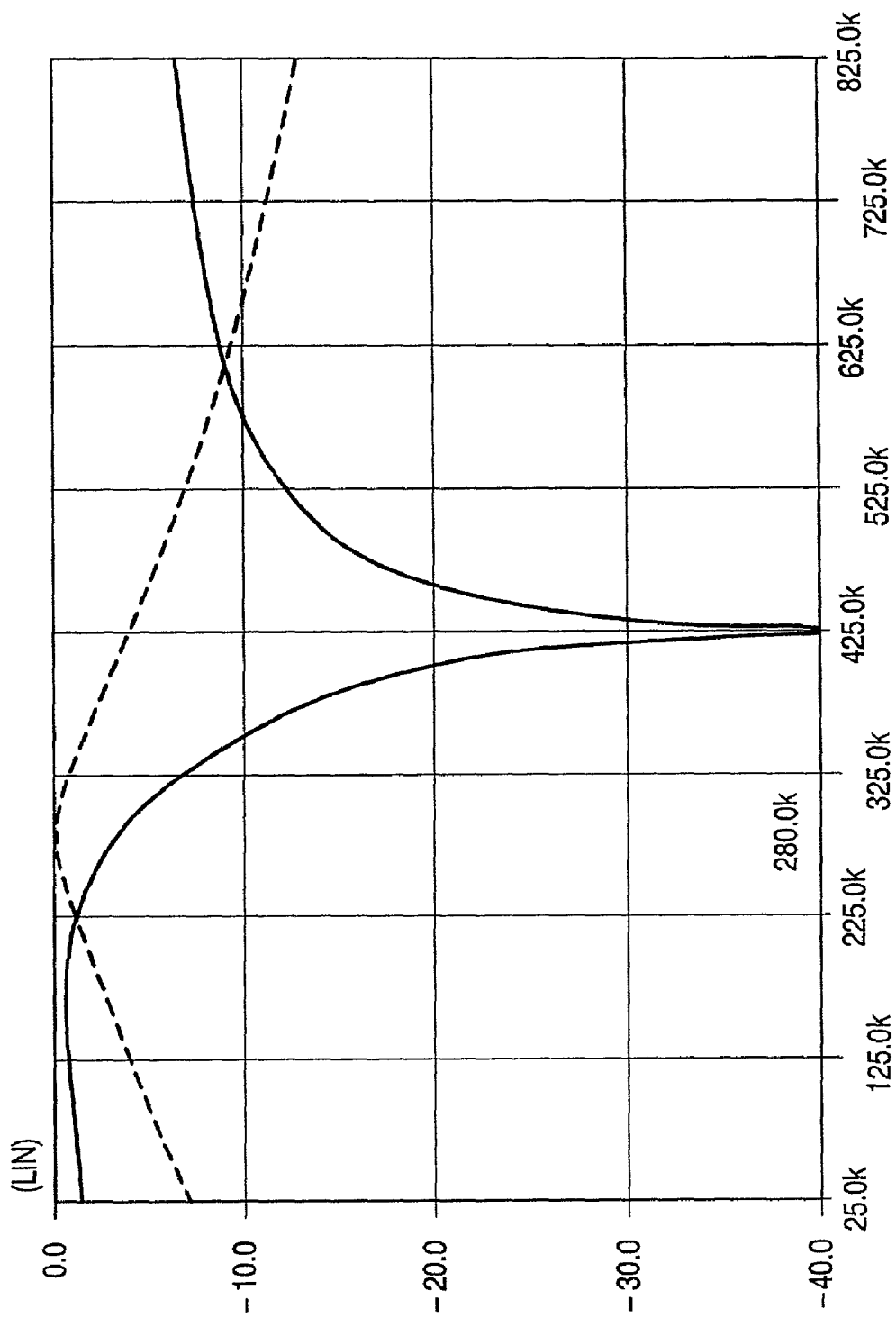
Figure 13:
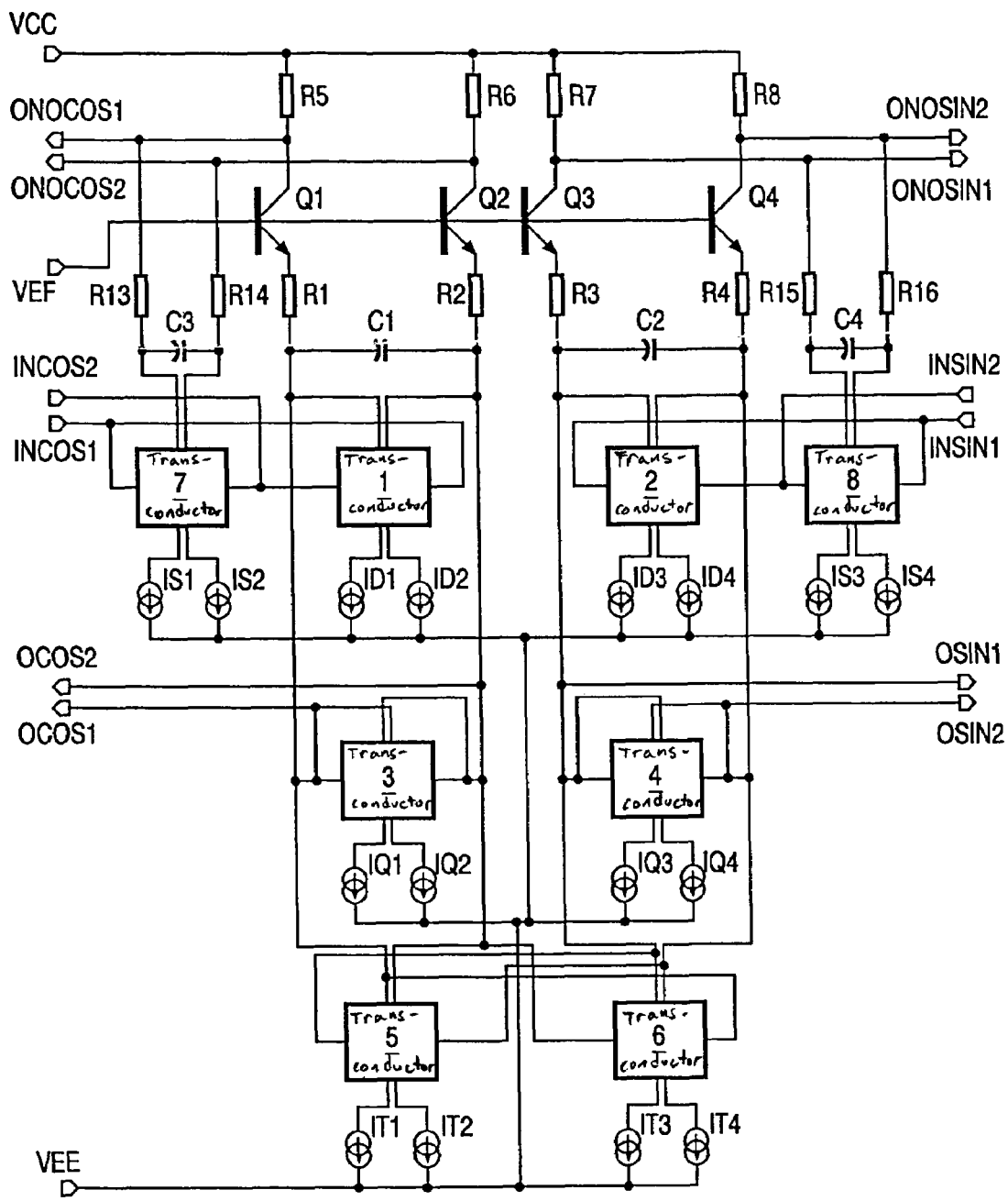
Figure 14:
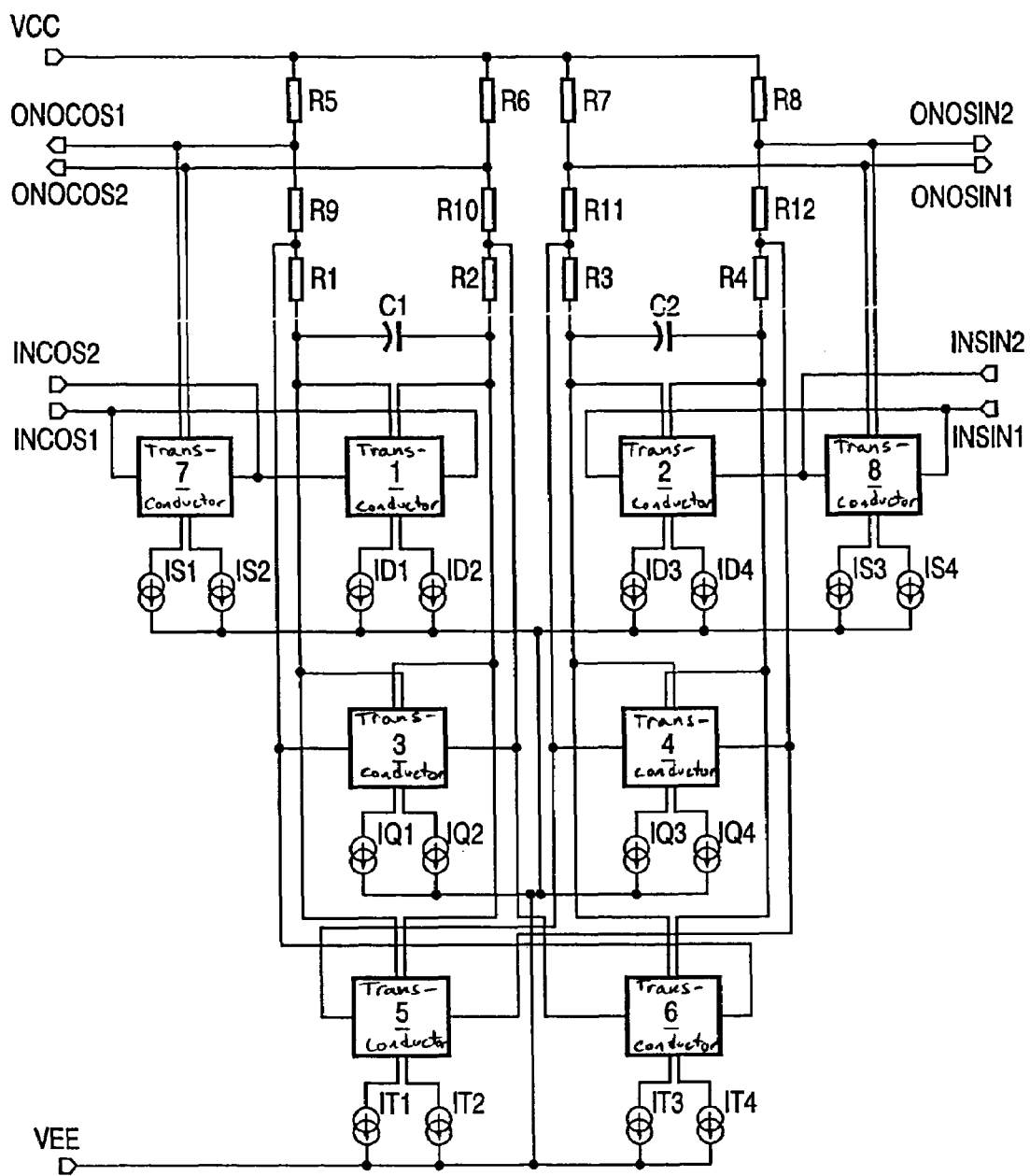
Figure 15:
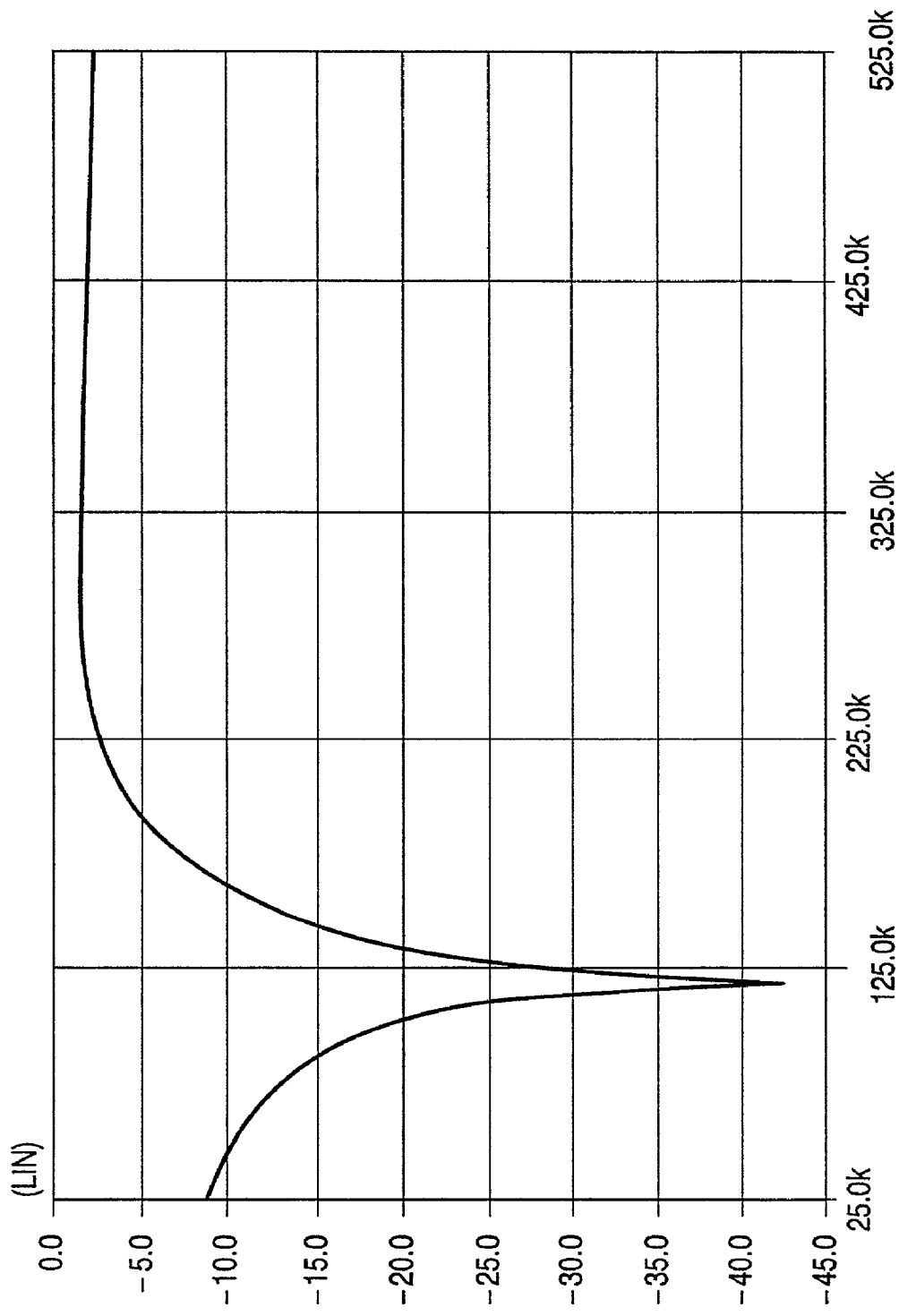

These and other embodiments of the invention will be apparent from and elucidated with reference to the embodiments described hereinafter. The figures show:

FIG. 1 a prior art polyphase bandpass filter;
FIG. 2 a prior art difference amplifier;
FIG. 3 a prior art notch filter;
FIG. 4 a transfer function of a bandpass filter;
FIG. 5 a transfer function of a polyphase-notchfilter;
FIG. 6 a polyphase-notchfilter according to the invention;
FIG. 7 a second polyphase-notchfilter according to the invention;
FIG. 8 a transfer function;
FIG. 9 a third polyphase-notchfilter according to the invention;
FIG. 10 a transfer function;
FIG. 11 a fourth polyphase-notchfilter according to the invention;
FIG. 12 a transfer function;
FIG. 13 a fifth polyphase-notchfilter according to the invention;
FIG. 14 a sixth polyphase-notchfilter according to the invention;
FIG. 15 a transfer function.

FIG. 6 shows a polyphase-notchfilter, comprising a polyphase-bandpass filter shown in FIG. 1. Compared to FIG. 1, the polyphase-notchfilter in FIG. 6 further comprises transconductors 7,8, current sources IS1–IS4, and resistors R5–R8. Also output ports ONOCOS1,2, ONOSIN1,2 are provided. Said transconductors 7,8 are coupled anti-parallel to said transconductors 1,2, where bas (basinv) of transconductor 7 is coupled to basinv (bas) of transconductor 1. Also bas (basinv) of transconductor 8 is coupled to basinv (bas) of transconductor 2. Said output ports ONOCOS1 (2) are coupled with said output ports col (colinv) of said transconductors 7 and with said polyphase-bandpass filter via a lowpass filter circuit build from R1–R5, R2–R6, C1. Said output ports ONOSIN1 (2) are coupled with said output ports col (colinv) of said transconductors 8, and with said polyphase-bandpass filter via a lowpass filter circuit build from R3–R7, R4–R8, C2. A notch filter function at the output ports of ONOCOS, ONOSIN results in case R1=R2=R3=R4, R5=R6=R7=R8, and IS=ID+IQ. By variation of IQ and IS the Q-value of the Polyphase-notchfilter can be adjusted. The amplification of the filter can be adjusted with resistors R5–R8. The resonance frequency is adjustable via IT. By adding the currents at the output ports ONOCOS, ONOSIN, the notch filter function is realised.

In FIG. 5, the transfer function of the Polyphase-notch-filter shown in FIG. 6 is plotted. This transfer function results with R1=R2=R3=R4=6 kOhm, R5=R6=R7=R8=6 kOhm, C1=C2=70 pF, IT=15,3 uA, IQ=2,2 uA, ID=4,7 uA, and IS= 6,9 uA. This transfer function is in general symmetric to the resonance frequency.

In FIG. 7, another embodiment is depicted. In this embodiment, the output ports ONOCOS, ONOSIN are connected to a second voltage divider circuit R1–R9, R2–R10, R3–R11, R4–R12. ONOCOS1 (ONOCOS2) is connected over a first tap between R1 and R9 (R2 and R10) with col (colinv) of transconductor 1, bas (basinv) of transconductor 3, bas (basinv) of transconductor 6. ONOCOS1 (ONOCOS2) is connected over a second tap after R1 (R2) with colinv (col) of transconductor 3, col (colinv) of transconductor 5. ONOCOS1 and ONOCOS2 are lowpass filtered over R1–R9, R2–R10 and C1. ONOSIN1 (ONOSIN2) is connected over a first tap between R3 and R11 (R4 and R12) with colinv (col) of transconductor 2, basinv (bas) of transconductor 4, bas (basinv) of transconductor 5. ONOSIN1 (ONOSIN2) is connected over a second tap after R3 (R4) with col (colinv) of transconductor 4, colinv (col) of transconductor 6. ONOSIN1 and ONOSIN2 are lowpass filtered over R3–R11, R4–R12 and C2. In case R1=R2=R3=R4=0, the depicted polyphase-notchfilter has the same structure as the polyphase-notchfilter depicted in FIG. 6.

In case the sum of the resistors in each of said second voltage divider circuits R1–R9, R2–R10, R3–R11, R4–R12, is equal to the resistor value R1,R2,R3,R4 in FIG. 6, a higher damping for frequencies above the resonance frequency can be realised.

In FIG. 8, a transfer function for a polyphase-notchfilter depicted in FIG. 7, with IQ=0, ID=IS=10 uA, IT=15,3 uA, R1=R2=R3=R4=R9=R10=R11 R12=3 kOhm, R5=R6=R7=R8=6 kOhm, and C1=C2=70 pF is shown. The ordinate shows the amplitude of the output signal ONOCOS in decibel. The abscissa represents the frequency of the output signal. It can be seen that for frequencies above 425 kHz, a higher damping is realised. Also, the slope for frequencies between 225 kHz and 425 kHz is steeper. This transfer function is in general asymmetric to the resonance frequency.

FIG. 9 depicts a further embodiment of the notch filter. This notch filter comprises transistors Q1–Q4, which are fed by voltage supply $V_{EF}$. The base of said transistors Q1–Q4 is connected with $V_{EF}$. The collector of Q1–Q4 is connected with R5–R8, respectively. The emitter of Q1–Q4 is connected with R1–R4, respectively. The output ports ONOCOS, ONOSIN are connected to the collector of transistor Q1–Q4. The output ports COL, COLINV of transconductors 7,8 may be connected to the collector as well as the emitter of transistor Q1–Q4, respectively. Depicted is a connection of COL, COLINV with the collector of Q1–Q4. The connection of the output ports COL, COLINV with the transistors may by applied in any variation of the circuit arrangement.

By use of these transistors Q1–Q4, bandpass filter output signals are decoupled from notch filter output signals. Output ports OCOS, OSIN provide a bandpass filtered signal. Said output ports ONOCOS, ONOSIN provide notch filtered signals. A higher supply voltage VCC is needed for such a circuit arrangement. By variation of ID, IQ, and IT, filter parameters such as Q-value, resonance frequency, and amplification can be adjusted.

In FIG. 10, a transfer function for notch filtered signals is depicted as solid line, a transfer function for bandpass filtered signals is depicted as dashed line. The shown transfer functions result from a polyphase-notchfilter depicted in FIG. 9 with R1=R2=R3=R4=6 kOhm, R5=R6=R7=R8=6 kOhm, C1=C2=70 pF, ID=4,7 uA, IQ=2,2 uA, IS=6,9 uA, and IT=15,3 uA. The ordinate shows the amplitude of the output signals ONOCOS, OCOS in decibel. The abscissa represents the frequency of the output signal. This transfer function is in general symmetric to the resonance frequency.

FIG. 11 shows a combination of notch filters depicted in FIG. 7 and FIG. 9. By that it is possible to vary the slope of the transfer function and to provide a bandpass filtered signal and a notch filtered signal.

FIG. 12 shows the transfer functions of the polyphase-bandpass filter and the polyphase-notchfilter shown in FIG. 11. These transfer functions result with C1=C2=70 pF, ID=4,7 uA, IQ=2,2 uA, IS=6,9 uA, and IT=15,3 uA. IQ=0, R1=R2=R3=R4=R9=R10=R11=R12=3 kOhm, R5=R6=R7=R8=6 kOhm. The solid line represents the notch filter transfer function. The dashed line represents the bandpass filter function.

The ordinate shows the amplitude of the output signals ONOCOS, OCOS in decibel. The abscissa represents the frequency of the output signal. This transfer function is in general asymmetric to the resonance frequency.

In case, the input signal comprises higher harmonics, e.g. a rect-signal or a saw-signal, a polyphase-notchfilter according to FIG. 13 is preferred said transconductors 1, 2, 3, 4, 5, 6 feed their output signals onto lowpass filters R1,R2,C1 (R3,R4,C2), and these signals are added to the output signals from transconductors 7 (8), the signals from said transconductors 7 (8) have to be equally lowpass filtered. This is done by lowpass filters R13,14,C3 (R15,R16,C4). This lowpass filter R13,14,C3 (R15,R16,C4) may have the same structure and values as lowpass filter R1,R2,C1 (R3,R4,C2) Thus, the addition of signals is again possible at the output ports, and a notch filter function can be realised.

In FIG. 14, another polyphase-notchfilter is depicted. This polyphase-notchfilter is a variation of FIG. 7. Different from FIG. 7 is that the second taps after R1, R2 (R3, R4), instead of the first tap between R1–R9, R2–R10 (R3–R11, R4–R12), are connected to col, colinv of transconductor 1 (2). By that the transfer function my be flipped around the resonance frequency. This variation is applicable in any variation of a polyphase-notchfilter.

FIG. 15 shows the transfer function of the polyphase-notchfilter shown in FIG. 14. This transfer functions results with C1=C2=70 pF, IQ=0 uA, IS=ID=10 uA, and IT=8,6 uA, R1=R2=R3=R4=R9=R10=R11=R12=3 kOhm, R5=R6=R7=R8=6 kOhm. Higher damping for frequencies below the resonance frequency can be realised. Also the slope from the resonance frequency to higher frequencies is steep. In combination with a filter according to FIG. 8, it is possible to achieve a symmetric transfer function.

The depicted polyphase-notchfilters can be integrated on one integrated circuit. Filter parameters as Q-value, resonance frequency, and amplification can be adjusted easily. A good matching of the components can be realised easily, as only few components have to be matched. The power consumption of the depicted filters is low. Chip area and supply current can be saved. A high reliable filter is realised, because of reduced matching requirements.

What is claimed is:

1. Polypbase-Notchfilter for filtering input signals comprising:
   supply voltage input means for supplying voltage;
   bandpass filter means comprising,
   a first set of at least two first voltage-controlled current sources,
   a first set of at least two input means coupled to said first set of at least two first voltage-controlled current sources for receiving first input signals applied to said bandpass filter means,
   a first set of at least two output means providing filtered output signals of said first input signals,
   first coupling means coupled to said supply voltage input means, said first set of at least two first voltage-controlled current sources and said first set of at least two output means,
   a second set of at least two first voltage-controlled current sources,
   a second set of at least two input means coupled to said second set of at least two first voltage-controlled current sources for receiving second input signals applied to said bandpass filter means,
   a second set of at least two output means providing filtered output signals of said second input signals,
   second coupling means coupled to said supply voltage input means, said second set of at least two first voltage-controlled current sources and said second set of at least two output means, and
   at least one second voltage-controlled current source coupled to said first set of at least two input means and said first set of at least two output means and further coupled to said first set of at least two first voltage-controlled current sources so that input terminals are connected opposite in polarity, and
   at least another second voltage-controlled current source coupled to said second set of at least two input means and said second set of at least two output means and further coupled to said second set of at least two first voltage-controlled current sources so that input terminals are connected opposite in polarity.

2. Polyphase-Notchfilter according to claim 1, characterized in that at least one of said first and second voltage-controlled current sources comprise a tansconductor coupled to at least one current source.

3. Polyphase-Notchfilter according to claim 1, characterized in that each of said first and second voltage-controlled current sources comprise inverted and non-inverted voltage-controlled input means and inverted and non-inverted current output means.

4. Polyphase-Notchfilter according to claim 1, characterized in that at least one of said first and second decoupling means comprise a lowpass filter means.

5. Polyphase-Notchfilter according to claim 4, characterized in that said lowpass filter means comprises an R-C circuit.

6. Polyphase-Notchfilter according to claim 1, cbaracterized in that at least one output of said first and second voltage-controlled current sources is coupled with a reference potential.

7. Polyphase-Notchfilter of claim 1, characterized in that at least one of said first and second decoupling means comprises a transistor.

8. Polyphase-Notchfilter for filtering input signals comprising:
   supply voltage input means for supplying voltage;
   bandpass filter means comprising,
   a first voltage-controlled current source,
   a first input means coupled to said first voltage-controlled current source for receiving first input signals applied to said bandpass filter means,
   a first output means providing filtered output signals of said first input signals,
   a first coupling means coupled to said supply voltage input means, said first voltage-controlled current source and said first output means,
   a second voltage-controlled current source,
   a second input means coupled to said second voltage-controlled current source for receiving second input signals applied to said bandpass filter means,
   a second output means providing filtered output signals of said second input signals,
   a second coupling means coupled to said supply voltage input means, said second voltage-controlled current source and said second output means, wherein at least one of said first and second decoupling means includes a lowpass filter means comprising an R-C circuit, and
   a third voltage-controlled current source coupled to said first input means and said first output means and further coupled to said first voltage-controlled current source so that input terminals of said third voltage-controlled current source are connected opposite in polarity to input terminals of said first voltage-controlled current source, and
   a fourth voltage-controlled current source coupled to said second input means and said second output means and further coupled to said second voltage-controlled current source so that input terminals of said fourth voltage-controlled current source are connected opposite in polarity to input terminals of said second voltage-controlled current source.

9. Polyphase-Notchfilter according to claim 8, characterized in that at least one of said first and second voltage-controlled current sources comprise a transconductor coupled to at least one current source.

10. Polyphase-Notchfilter according to claim 8, characterized in that both of said first and second decoupling means include a lowpass filter means comprising an R-C circuit.

11. Polyphase-Notchfilter according to claim 8, characterized in that at least one output of said first and second voltage-controlled current sources is coupled with a reference potential.

* * * * *